US010224938B2

(12) United States Patent
Takahashi

(10) Patent No.: US 10,224,938 B2
(45) Date of Patent: Mar. 5, 2019

(54) APPARATUSES AND METHODS FOR INDIRECTLY DETECTING PHASE VARIATIONS

(71) Applicant: MICRON TECHNOLOGY, INC., Boise, ID (US)

(72) Inventor: Hiroki Takahashi, Tokyo (JP)

(73) Assignee: Micron Technology, Inc., Boise, ID (US)

(*) Notice: Subject to any disclaimer, the term of this patent is extended or adjusted under 35 U.S.C. 154(b) by 22 days.

(21) Appl. No.: 15/660,405

(22) Filed: Jul. 26, 2017

(65) Prior Publication Data

US 2019/0036535 A1    Jan. 31, 2019

(51) Int. Cl.
H03L 7/06    (2006.01)
H03L 7/081   (2006.01)
H03L 7/091   (2006.01)

(52) U.S. Cl.
CPC .......... H03L 7/0812 (2013.01); H03L 7/091 (2013.01)

(58) Field of Classification Search
USPC ................................ 327/147–149, 156–158
See application file for complete search history.

(56) References Cited

U.S. PATENT DOCUMENTS

| 4,644,248 A * | 2/1987 | Brennen ............... H02J 3/1835 323/205 |
| 5,004,933 A | 4/1991 | Widener |
| 5,610,558 A * | 3/1997 | Mittel .................. H03L 7/07 327/147 |
| 5,935,253 A | 8/1999 | Conary et al. |
| 6,111,810 A | 8/2000 | Fujita |
| 6,219,384 B1 | 4/2001 | Kliza et al. |
| 6,260,128 B1 | 7/2001 | Ohshima et al. |
| 6,275,077 B1 | 8/2001 | Tobin et al. |
| 6,292,040 B1 | 9/2001 | Iwamoto et al. |
| 6,327,318 B1 | 12/2001 | Bhullar et al. |
| 6,424,592 B1 | 7/2002 | Maruyama |

(Continued)

FOREIGN PATENT DOCUMENTS

| CN | 1952868 A | 4/2007 |
| CN | 101752009 A | 6/2010 |

(Continued)

OTHER PUBLICATIONS

U.S. Appl. No. 15/139,102, entitled "Methods and Apparatuses Including Command Delay Adjustment Circuit", filed Apr. 26, 2016.

(Continued)

*Primary Examiner* — Adam Houston
(74) *Attorney, Agent, or Firm* — Dorsey & Whitney LLP

(57) ABSTRACT

Apparatuses and methods for indirect phase variation detection are disclosed herein. An example apparatus may include a clock generator circuit comprising a delay-locked loop (DLL) circuit configured to adjust a phase of a clock signal based on a phase of a feedback clock signal during an initial phase-lock operation. The DLL circuit includes a phase deviation detection circuit configured to detect a variation in a phase of the clock signal based on variations in gate delays of an oscillation circuit, and to initiate a subsequent phase-lock operation in response to detecting variations in the gate delays of the oscillation circuit.

20 Claims, 7 Drawing Sheets

(56) References Cited

U.S. PATENT DOCUMENTS

| | | |
|---|---|---|
| 6,438,055 B1 | 8/2002 | Taguchi et al. |
| 6,459,313 B1 | 10/2002 | Godbee et al. |
| 6,489,823 B2 | 12/2002 | Iwamoto |
| 6,510,095 B1 | 1/2003 | Matsuzaki et al. |
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,759,881 B2 * | 7/2004 | Kizer ............ G06F 1/10 327/147 |
| 6,781,861 B2 | 8/2004 | Gomm et al. |
| 6,839,288 B1 | 1/2005 | Kim et al. |
| 6,861,901 B2 | 3/2005 | Prexl et al. |
| 6,868,504 B1 | 3/2005 | Lin |
| 6,885,252 B2 * | 4/2005 | Hsu ............ H03L 7/087 327/156 |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,158,443 B2 | 1/2007 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,319,728 B2 | 1/2008 | Bell et al. |
| 7,336,752 B2 | 2/2008 | Vlasenko et al. |
| 7,340,632 B2 | 3/2008 | Park |
| 7,355,464 B2 | 4/2008 | Lee |
| 7,375,560 B2 | 5/2008 | Lee et al. |
| 7,411,852 B2 | 8/2008 | Nishioka et al. |
| 7,428,284 B2 | 9/2008 | Lin |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,541,851 B2 | 6/2009 | Gomm et al. |
| 7,580,321 B2 | 8/2009 | Fujisawa et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,675,791 B2 | 3/2010 | Kim |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,876,640 B2 | 1/2011 | Lin |
| 7,885,365 B2 | 2/2011 | Hagleitner et al. |
| 7,913,103 B2 | 3/2011 | Gold et al. |
| 7,928,782 B2 | 4/2011 | Booth et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,970,090 B1 * | 6/2011 | Tetzlaff ............ H04L 7/033 327/147 |
| 7,983,094 B1 | 7/2011 | Roge et al. |
| 8,018,791 B2 | 9/2011 | Kwak |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,536,915 B1 * | 9/2013 | Terrovitis ............ H03L 7/16 327/147 |
| 8,644,096 B2 | 2/2014 | Bringivijayaraghavan |
| 8,717,078 B2 | 5/2014 | Idgunji et al. |
| 8,732,509 B2 | 5/2014 | Kwak |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 9,508,409 B2 | 11/2016 | Kwak |
| 9,529,379 B2 | 12/2016 | Kwak |
| 9,530,473 B2 | 12/2016 | Mazumder |
| 9,531,363 B2 | 12/2016 | Miyano |
| 9,601,170 B1 | 3/2017 | Mazumder et al. |
| 9,813,067 B2 | 11/2017 | Ma et al. |
| 9,865,317 B2 | 1/2018 | Ishibashi et al. |
| 9,997,220 B2 | 6/2018 | Miyano et al. |
| 2001/0015924 A1 | 8/2001 | Arimoto et al. |
| 2002/0057624 A1 | 5/2002 | Manning |
| 2002/0110035 A1 | 8/2002 | Li et al. |
| 2002/0149506 A1 | 10/2002 | Altrichter et al. |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2004/0000934 A1 | 1/2004 | Jeon |
| 2004/0008064 A1 * | 1/2004 | Kashiwazaki ............ G06F 1/12 327/158 |
| 2004/0041604 A1 * | 3/2004 | Kizer ............ G06F 1/10 327/157 |
| 2005/0017774 A1 * | 1/2005 | Chow ............ H03L 7/07 327/156 |
| 2005/0024107 A1 | 2/2005 | Takai et al. |
| 2005/0047222 A1 | 3/2005 | Rentschler |
| 2005/0052309 A1 | 3/2005 | Wang |
| 2005/0132043 A1 | 6/2005 | Wang et al. |
| 2005/0184780 A1 | 8/2005 | Chun |
| 2005/0270852 A1 | 12/2005 | Dietrich et al. |
| 2006/0033542 A1 * | 2/2006 | Lin ............ H03L 7/0814 327/156 |
| 2006/0055441 A1 * | 3/2006 | McClannahan ...... G11C 7/1066 327/158 |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2006/0250861 A1 | 11/2006 | Park et al. |
| 2006/0250883 A1 | 11/2006 | Szczypinski |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0180144 A1 | 7/2008 | Mai |
| 2008/0204071 A1 | 8/2008 | Lee et al. |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |

(56) References Cited

U.S. PATENT DOCUMENTS

| | | |
|---|---|---|
| 2009/0219068 A1 | 9/2009 | Mizuhashi et al. |
| 2009/0232250 A1 | 9/2009 | Yamada et al. |
| 2009/0290445 A1 | 11/2009 | Kinoshita et al. |
| 2009/0315600 A1 | 12/2009 | Becker et al. |
| 2010/0001762 A1 | 1/2010 | Kim |
| 2010/0052739 A1 | 3/2010 | Shibata |
| 2010/0054060 A1 | 3/2010 | Ku |
| 2010/0058261 A1 | 3/2010 | Markov et al. |
| 2010/0066422 A1 | 3/2010 | Tsai |
| 2010/0128543 A1 | 5/2010 | Kwon et al. |
| 2010/0142308 A1 | 6/2010 | Kim |
| 2010/0165769 A1 | 7/2010 | Kuroki |
| 2010/0165780 A1 | 7/2010 | Bains et al. |
| 2010/0177589 A1 | 7/2010 | Kinoshita |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0295584 A1 | 11/2010 | Sano |
| 2010/0327926 A1 | 12/2010 | Takahashi |
| 2011/0026318 A1 | 2/2011 | Franceschini et al. |
| 2011/0047319 A1 | 2/2011 | Jeon et al. |
| 2011/0055671 A1 | 3/2011 | Kim et al. |
| 2011/0057697 A1 | 3/2011 | Miyano |
| 2011/0058437 A1 | 3/2011 | Miyano |
| 2011/0102039 A1 | 5/2011 | Shin |
| 2011/0194575 A1 | 8/2011 | Chen et al. |
| 2011/0228625 A1 | 9/2011 | Bringivijayaraghavan et al. |
| 2011/0238941 A1 | 9/2011 | Xu et al. |
| 2011/0298505 A1* | 12/2011 | Khoury ................ H03L 7/0818 327/156 |
| 2011/0298512 A1 | 12/2011 | Kwak |
| 2011/0304365 A1* | 12/2011 | Bunch ................ H03L 7/1976 327/157 |
| 2012/0084575 A1 | 4/2012 | Flores et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002318 A1* | 1/2013 | Lu ........................ H03L 7/0995 327/156 |
| 2013/0002320 A1 | 1/2013 | Lin et al. |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0177361 A1 | 6/2014 | Kitagawa |
| 2014/0258764 A1 | 9/2014 | Kwak |
| 2014/0293719 A1 | 10/2014 | Jung |
| 2014/0340158 A1 | 11/2014 | Thandri et al. |
| 2015/0097604 A1* | 4/2015 | Taniguchi ............... H03L 7/085 327/158 |
| 2015/0156009 A1 | 6/2015 | Bogdan |
| 2015/0170725 A1 | 6/2015 | Kwak |
| 2015/0235691 A1 | 8/2015 | Kwak |
| 2015/0263739 A1 | 9/2015 | Jung et al. |
| 2015/0263740 A1* | 9/2015 | Jung .................... H03L 7/0812 327/158 |
| 2015/0340072 A1 | 11/2015 | Mazumder |
| 2016/0013799 A1* | 1/2016 | Li ........................... H03L 7/091 327/115 |
| 2016/0056807 A1 | 2/2016 | Neidengard et al. |
| 2016/0322964 A1 | 11/2016 | Miyano |
| 2016/0365860 A1 | 12/2016 | Ma et al. |
| 2017/0288682 A1 | 10/2017 | Ma et al. |
| 2017/0309320 A1 | 10/2017 | Ishibashi et al. |
| 2017/0309323 A1 | 10/2017 | Ishibashi et al. |

FOREIGN PATENT DOCUMENTS

| | | |
|---|---|---|
| JP | 2013-222997 A | 10/2013 |
| TW | 201303735 | 1/2013 |

OTHER PUBLICATIONS

U.S. Appl. No. 15/243,651, entitled "Apparatuses and Methods for Adjusting Delay of Command Signal Path", filed Aug. 22, 2016.

Interfacing DDR SDRAM with Stratix II Devices, Version 3.2, Altera Corp, Sep. 2008.

U.S. Appl. No. 15/628,260, entitled "Clock Signal and Supply Voltage Variation Tracking", filed Jun. 20, 2017.

U.S. Appl. No. 15/595,056, entitled: "Methods and Apparatuses Including Command Delay Adjustment Circuit", filed May 15, 2017.

Lee, "How to Implement DDR SGRAM in Graphic System", Samsung Electric, 4Q1998 (Oct.-Dec. 1998).

U.S. Appl. No. 16/000,149 titled "Apparatuses and Methods for Adjusting Delay of Command Signal Path", filed Jun. 5, 2018, pp. all.

* cited by examiner

APPARATUSES AND METHODS FOR INDIRECTLY DETECTING PHASE VARIATIONS

BACKGROUND

The pursuit of making computing systems more powerful, more power efficient, and more compact has led to increased operating speeds and lower power consumption. A critical component of operating at high clock speeds is maintaining synchronous clocks between parts of a system. Continuously monitoring clock timing may consume considerable power, which may reduce power available to perform other operations in a system.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
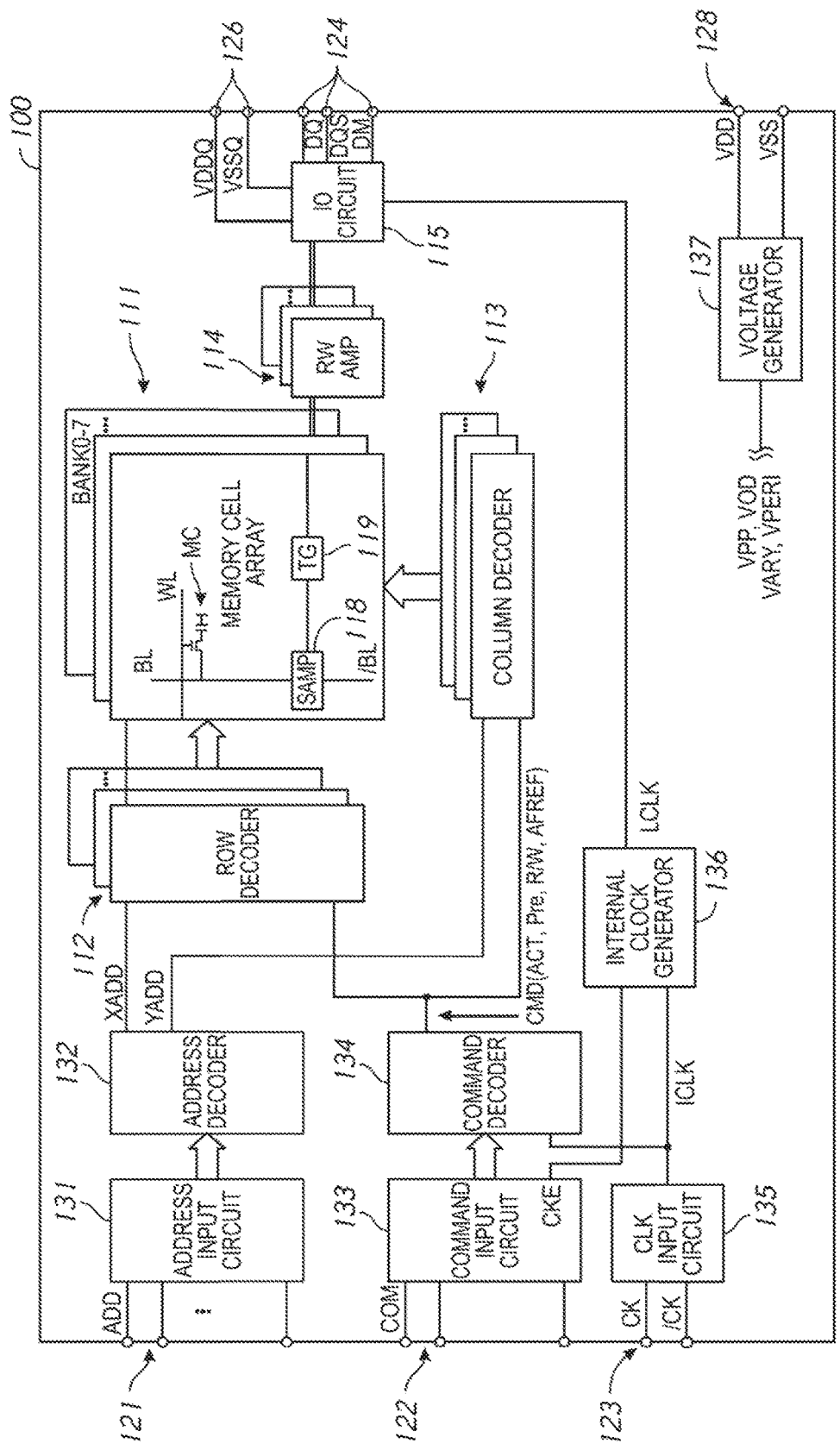
FIG. 1 is a block diagram showing an overall configuration of a semiconductor device according to a first embodiment of the present disclosure.

FIG. 1 is a block diagram showing an overall configuration of a semiconductor device 100 according to a first embodiment of the present disclosure. The semiconductor device 100 according to the present embodiment is a synchronous DRAM (SDRAM) of, for example, a Double Data Rate 3 (DDR3) or Double Data Rate 4 (DDR4) type. The semiconductor device 100 may be integrated on a single semiconductor chip and has a memory cell array 111. The memory cell array 111 is provided with a plurality of word lines WL and a plurality of bit lines BL and has a configuration in which memory cells MC are disposed at the intersection points thereof. Selection of the word lines WL is carried out by a row decoder 112, and selection of bit lines BL is carried out by a column decoder 113. The memory cell array 111, the row decoder 112, the column decoder 113, and a read/write amplifier 114 are divided into eight banks BANK0 to BANK7.

Moreover, the semiconductor device 100 is provided with address terminals 121, command terminals 122, clock terminals 123, data terminals 124, and power supply terminals 126 and 128 as external terminals.

The address terminals 121 are the terminals to which address signals ADD are input from outside. The address signals ADD are supplied to an address decoder 132 via an address input circuit 131. The address decoder 132 supplies a row address XADD to the row decoder 112 and supplies a column address YADD to the column decoder 113.

The command terminals 122 are the terminals to which command signals COM are input from outside. The command signals COM are supplied to a command decoder 134 via a command input circuit 133. The command decoder 134 is a circuit which generates various internal commands by decoding the command signals COM. Examples of the internal commands include active signals ACT, pre-charge signals Pre, read/write signals R/W, and refresh signals AREF.

The active signal ACT is a pulse signal which is activated when the command signal COM is indicating row access (active command). When the active signal ACT is activated, the row decoder 112 of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 112 of the specified bank address and the word line WL specified by the row address XADD controlled thereby are deactivated.

The read/write signal R/W is a pulse signal which is activated when the command signal COM is indicating column access (read command or write command). When the read/write signal R/W is activated, the column decoder 113 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 124 to outside via a sense amplifier SAMP 118, a transfer gate TG 119, the read/write amplifier 114, and an input/output circuit 115.

On the other hand, if the active command and the write command are input, if the row address XADD and the column address YADD are input in synchronization with them, and, then, if write data DQ is input to the data terminal 124, the write data DQ is supplied to the memory cell array 11 via the input/output circuit 115, the read/write amplifier 114, the transfer gate TG, and the sense amplifier SAMP and is written to the memory cell MC specified by the row address XADD and the column address YADD. It will be appreciated that the write DQ and the read DQ may include multilevel signals, and the input/output circuit 115 may include circuitry to encode and decode multilevel signals.

The refresh signal AREF is a pulse signal which is activated when the command signal COM is indicating an auto-refresh command. Also, when the command signal COM is indicating a self-refresh entry command, the refresh signal AREF is activated once immediately after command input, thereafter, is cyclically activated at desired internal timing, and a refresh state is continued. By a self-refresh exit command thereafter, the activation of the refresh signal AREF is stopped and returns to an IDLE state.

External clock signals CK and /CK are input to the clock terminals 123. The external clock signals CK and the external clock signals /CK are mutually complementary signals, and both of them are supplied to the clock input circuit 135. The clock input circuit 135 generates internal clock signals ICLK based on the external clock signals CK and /CK. The internal clock signals ICLK are supplied to the command decoder 134, an internal clock generator 136, etc. The internal clock generator 136 generates internal clock signals LCLK, which control the operation timing of the input/output circuit 115. The internal clock generator 136 may include delay-locked loop (DLL) or phase-locked loop (PLL) circuitry to adjust a phase of the LCLK signal relative to the ICLK signal to align the phase of the DQS signal with the phase of the CK signal. Rather than continuously monitoring the ICLK and LCLK signals to detect phase changes (e.g., caused by voltage or temperature drift, or some other cause), the internal clock generator 136 may further include circuitry that indirectly detects whether disturbance in the CK or LCLK signals has caused a phase drift that requires re-alignment.

The data terminal 124 also receives data mask signals DM, which, when activated, prohibit corresponding data from being overwritten.

The power supply terminals 128 are the terminals to which power supply potentials VDD and VSS are supplied. The power supply potentials VDD and VSS supplied to the power supply terminals 128 are supplied to a voltage generator 137. The voltage generator 137 generates various internal potentials VPP, VOD, VARY, VPERI, etc. based on the power supply potentials VDD and VSS. The internal potential VPP is the potential mainly used in the row decoder 112, the internal potentials VOD and VARY are the potentials used in the sense amplifier SAMP in the memory cell array 111, and the internal potential VPERI is the potential used in many other circuit blocks.

The power supply terminals 126 are the terminals to which power supply potentials VDDQ and VSSQ are supplied. The power supply potentials VDDQ and VSSQ supplied to the power supply terminals 126 are supplied to the input/output circuit 115. The power supply potentials VDDQ and VSSQ are the same potentials as the power supply potentials VDD and VSS, respectively, which are supplied to the power supply terminals 128. However, the dedicated power supply potentials VDDQ and VSSQ are used for the input/output circuit 115 so that power supply noise generated by the input/output circuit 115 does not propagate to other circuit blocks.

Figure 2:
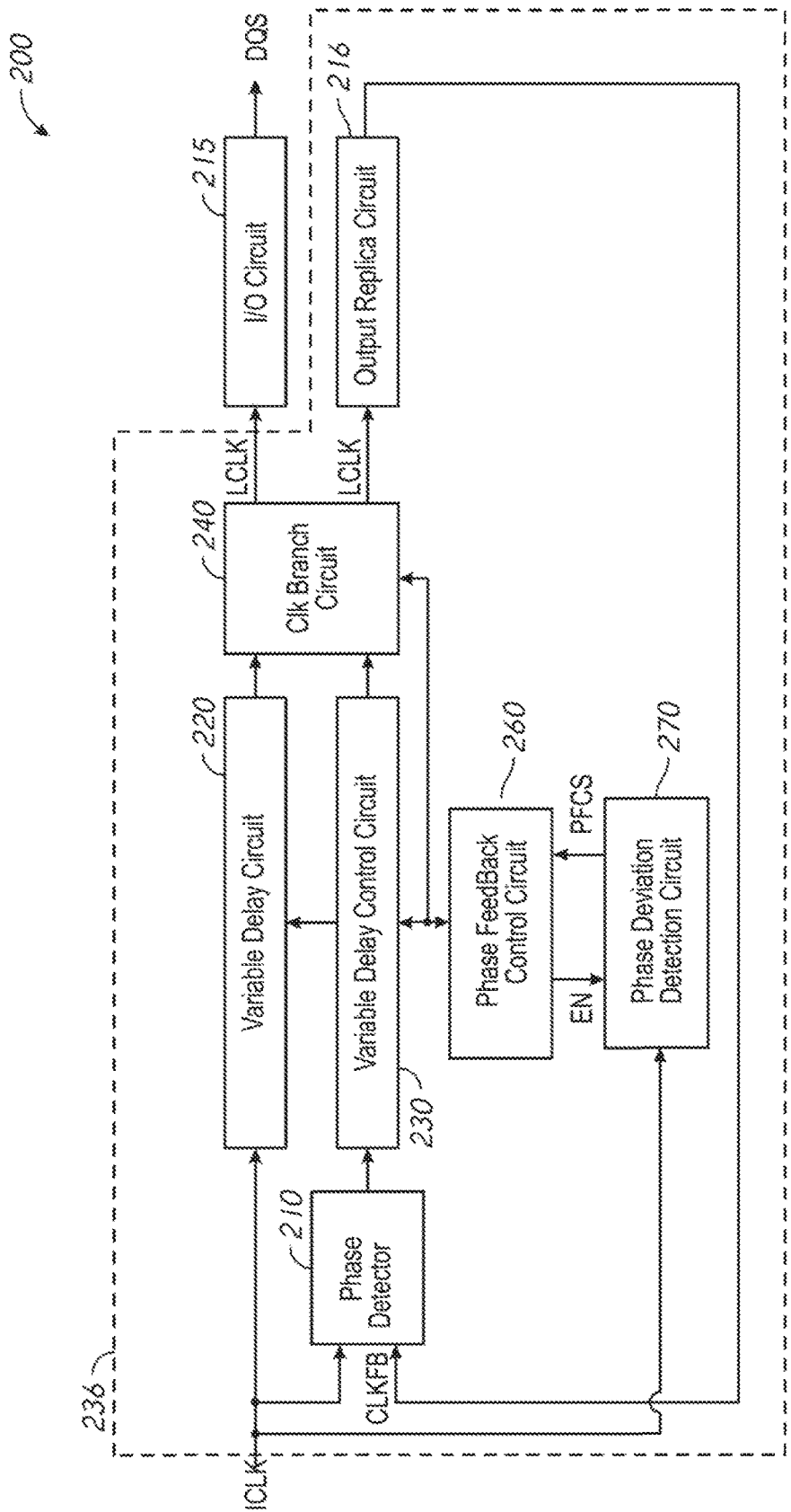
FIG. 2 is a block diagram of a semiconductor device including a delay-locked loop (DLL) circuit in accordance with an embodiment of the disclosure

FIG. 2 depicts a block diagram of an internal clock generator 236 of a semiconductor device 200 in accordance with an embodiment of the disclosure. The internal clock generator 236 may be referenced as a clock adjusting circuit and/or a delay-locked loop (DLL) circuit. As will be described in more detail below, the internal clock generator 236 may adjust a phase of a clock signal. The internal clock generator 236 may include a variable delay circuit 220, a variable delay control circuit 230, a clock branch circuit 240, an I/O circuit 215, an output replica circuit 216, a phase detector 210, a phase feedback control circuit 260, and a phase deviation detection circuit 270. The variable delay circuit 220 may be controlled by the variable delay control circuit 230. The variable delay circuit 220 may receive an internal signal ICLK and apply a delay to the ICLK signal to provide an output signal to the clock branch circuit 240. The clock branch circuit 240 may provide local internal clock signals LCLK to the I/O circuit 215 and to the output replica circuit 216. The variable delay circuit 220 may include coarse and fine delay elements to adjust timing of the ICLK signal.

The delay of the variable delay circuit 220 may be adjusted based on a comparison between a phase of a feedback signal CLKFB (e.g., the LCLK signal delayed by the output replica circuit 216) and a phase of the ICLK signal at the phase detector 210. The phase detector 210 may provide shift signals to the variable delay control circuit 230 that are indicative of a difference between the phases of the CLKFB and ICLK signals. Responsive to the shift signals, the variable delay control circuit 230 provides control signals to control the variable delay circuit 220 to adjust the delay applied to the LCLK signal.

The variable delay circuit 220 may provide the output signal to the clock branch circuit 240, which may provide respective branch LCLK signals to the I/O circuit 215 and to the output replica circuit 216. The output replica circuit 216 may model a propagation delay of at least a portion of the circuitry of the I/O circuit 215. The I/O circuit 215 may provide, for example, the DQS signal at an output. The I/O circuit 215 may correspond to the input/output circuit 115 of FIG. 1.

The phase feedback control circuit 260 may control when the internal clock generator 236 is in a phase-lock state or needs to perform a phase-lock operation. The phase feedback control circuit 260 may also assert an enable signal EN (e.g., high logic level) to the phase deviation detection circuit 270 to initiate a phase tracking operation at the phase deviation detection circuit 270. The EN signal may indicate an initial phase-lock state. In response to the EN signal, the phase deviation detection circuit 270 may indirectly track phase variation associated with the ICLK and CLKFB signals, and may indicate to the phase feedback control circuit 260 via phase feedback control state signal PFCS that a phase variation of the ICLK and CLKFB signals is detected. The phase deviation detection circuit 270 may leverage relative changes in gate delay due to variation in supply voltage and temperature to detect possible changes in relative phases of the ICLK and CLKFB signals. The phase deviation detection circuit 270 may include an oscillation circuit that is used to count a number of oscillations of the ICLK signal over a period of time, and track whether that value changes from one measurement to the next. If a change is detected, the phase deviation detection circuit 270 may provide the PFCS signal to the phase feedback control circuit 260. The phase feedback control circuit 260 may initiate a phase-lock operation in response to the PFCS signal by providing a phase feedback activation signal PFA to the variable delay control circuit 230 and to the clock branch circuit 240. The PFA may disable the clock branch circuit 240 from providing the LCLK signals and may cause the variable delay control circuit 230 to start the phase-lock operation.

In operation, during a phase-lock operation, the feedback control circuit 260 disables the clock branch circuit 240 from providing the LCLK signals and enables the variable delay control circuit 230 to adjust the delay of the variable delay circuit 220 based on a phase relationship between the ICLK signal and the CLKFB signal. The clock branch circuit 240 is disabled to prevent downstream operations from taking place using a misaligned DQS clock signal. During the phase-lock operation, the phase detector 210 is configured to compare phases of the ICLK signal and the CLKFB signal (e.g., the LCLK signal delayed through the output replica circuit 216). Based on the phase comparisons, the phase detector 210 may provide the shift signals to the variable delay control circuit 230 to adjust the phase of the ICLK signal received at the variable delay circuit 220. Comparison of the phases of the ICLK and CLKFB signals and provision of the shift signals is repeated to align phases of the ICLK and the CLKFB signals. In response to detection by the phase feedback control circuit 260 that the phases of the ICLK and the CLKFB signals are aligned based on shift signals from the phase detector 210, the phase feedback control circuit 260 may cause the internal clock generator 236 to enter into a phase-lock state. During the phase-lock state, circuitry of the internal clock generator 236 responsible for tracking and adjusting a phase of the ICLK signal (e.g., circuitry of the phase feedback control circuit 260, the phase detector 210, and/or circuitry of the variable delay control circuit 230) is disabled to reduce power consumption.

In response to the EN signal from the phase feedback control circuit 260 (e.g., provided after entering an initial phase-lock state), the phase deviation detection circuit 270 may initiate an indirect phase variation tracking operation to detect whether the relative phases of the ICLK and CLKFB signals may have changed. To indirectly track phase variation, the phase deviation detection circuit 270 may detect variation in a gate delay caused by variation in a supply voltage and temperature. For example, the phase deviation detection circuit 270 may count a number of oscillations of an oscillation circuit within a predetermined time period, and compare the number of oscillations with a previous oscillation count to determine whether a phase variation has occurred. If the current count of oscillations is different than the previous count of oscillations by a predetermined threshold value, the phase deviation detection circuit 270 may provide the PFCS signal to the phase feedback control circuit 260. In response to receipt of the PFCS signal, the phase feedback control circuit 260 may cause the internal clock generator 236 into an unlocked state and go through the phase-lock operation to realign the phases of the ICLK and CLKFB signals.

Implementing the phase deviation detection circuit 270 to indirectly track phase variations based on gate delay while circuitry of the internal clock generator 236 for true or direct phase tracking is disabled may reduce power consumption as compared with continuously performing true or direct phase tracking operations. In addition, the ability of the phase deviation detection circuit 270 to continuously indirectly track phase variations using lower power circuitry (e.g., passive logic circuits) and efficiently re-enable the phase tracking circuitry of the internal clock generator 236 only when a phase variation is detected is advantageous as compared with implementations that use hard clock cycle counts or receive commands to re-enable the phase tracking circuitry of the internal clock generator 236. Hard counting of receiving commands may either result in higher power consumption, in delayed detection of phase deviations, or may initiate a phase check when the phases remain aligned.

Figure 3:
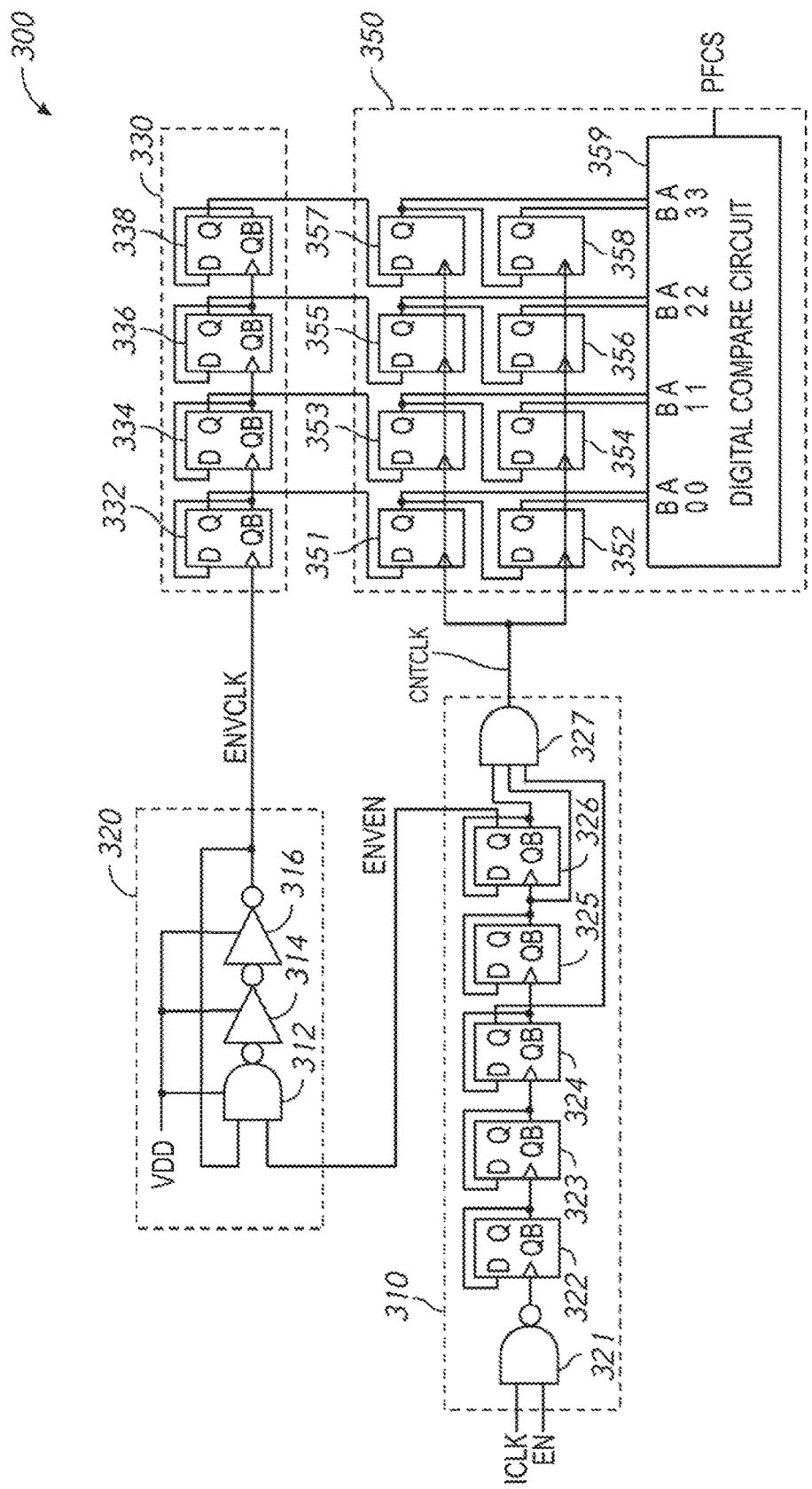
FIG. 3 is a block diagram of a phase deviation detection circuit in accordance with an embodiment of the disclosure.

FIG. 3 depicts a block diagram of a phase deviation detection circuit 300 in accordance with an embodiment of the disclosure. The phase deviation detection circuit 270 of FIG. 2 may be implemented by the phase deviation detection circuit 300, in some embodiments. The phase deviation detection circuit 300 may include a control circuit 310, an oscillation circuit 320, a counter circuit 330, and a calculation circuit 350.

The control circuit 310 (e.g., period determining circuit) may receive an enable signal EN and an internal clock signal ICLK and may provide an enable signal ENVEN and a count clock signal CNTCLK. The control circuit 310 may include a NAND gate 321 configured to receive the EN and ICLK signals. The control circuit 310 may further include a series of flip-flops 322-326. The clock input of the flip-flop 322 is coupled to an output of the NAND gate 321. The input D of the flip-flop 322 is coupled to its inverted output QB. For the other flip-flops 323-326, the clock inputs are coupled to the QB output of a preceding flip-flop 322-325, and the D inputs are each coupled to the respective QB outputs. The flip-flop 326 provides the ENVEN signal at its output Q. The control circuit 310 further includes an AND gate 327 that receives the QB output of the flip-flop 326, the QB output of the flip-flop 325, and the Q output of the flip-flop 324. The AND gate 327 may provide the CNTCLK signal to the calculation circuit 350.

The oscillation circuit 320 may receive the ENVEN signal from the control circuit 310 and provide a clock signal ENVCLK at an output. The oscillation circuit 320 may include a NAND gate 312 coupled in series with a pair of inverters 314 and 316. The NAND gate 312 may receive the ENVEN signal at a first input and an output of the inverter 316 at a second input. The output of the inverter 316 may provide the ENVCLK signal.

The counter circuit 330 includes serially coupled flip-flops 332, 334, 336, and 338. The clock input of the flip-flop 332 receives the ENVCLK signal from the oscillation circuit 320. The input D of the flip-flop 332 is coupled to its inverted output QB and the Q output is coupled to the calculation circuit 350. For, the other flip-flops 334, 336, and 338, the clock inputs are coupled to the QB outputs of the preceding flip-flop 332, 334, or 336. The D inputs are each coupled to the respective QB output, and the Q outputs are coupled to the calculation circuit 350.

The calculation circuit 350 may receive and latch the Q outputs from the flip-flops 332, 334, 336, and 338 as an indication of an oscillation count of the ENVCLK signal, and determine whether a previous oscillation count is different than a current (e.g., first) oscillation count. The calculation circuit 350 may include flip-flops 351, 353, 355, and 357 that collectively latch the current oscillation count, and flop-flops 352, 354, 356, and 358 that collectively latch the previous (e.g., second) oscillation count. The flip-flops 351, 353, 355, and 357 may be collectively referred to as a storing circuit and the flip-flops 352, 354, 356, and 358 may also be collectively referred to as a storing circuit. The flip-flops 351, 353, 355, and 357 may be temporarily store a count value and the flip-flops 352, 354, 356, and 358 may also be temporarily store a count value. The D inputs of the flip-flops 351, 353, 355, and 357 are coupled to the Q outputs of the respective flip-flops 332, 334, 336, and 338. The Q outputs of the of the flip-flops 351, 353, 355, and 357 are coupled to the D inputs of the respective flip-flops 352, 354, 356, and 358, as well as to the digital compare circuit 359 to provide the current oscillation count (e.g., A[3:0]). The Q outputs of the flip-flops 352, 354, 356, and 358 are coupled to a digital compare circuit 359 to provide the previous oscillation count (e.g., B[3:0]). The digital compare circuit 359 may include circuitry to compare the previous and current oscillation counts, and to provide an active PFCS signal when a difference between the counts exceeds a predetermined threshold.

In operation, the phase deviation detection circuit 300 maintains two sets of oscillation counts based on the ICLK signal, compares the counts to detect whether a phase has shifted based on changes in gate delays of the oscillation circuit 320, and provides an active PFCS signal when a difference between the oscillation counts exceeds a threshold. The control circuit 310 may receive the EN signal and the ICLK signal at the NAND gate 321. The EN signal may be received from a phase feedback control circuit, such as the phase feedback control circuit 260 of FIG. 2. The EN signal may indicate an initial phase-lock state. The output of the NAND gate 321 may be provided to the serially-coupled flip-flops 322-326. The flip-flops 322-326 may propagate signals based on the output of the NAND gate 321 to provide the ENVEN and CNTCLK signals. The ENVEN signal may have a period based on a count of the flip-flops 322-326. In an example, the ENVEN signal may have a period of 32 cycles of the ICLK signal. It is appreciated that a different period may be used. While the ENVEN signal is high, the oscillation circuit 320 may oscillate the ENVCLK signal with an oscillation frequency based on gate delays of the NAND gate 312 and the inverters 314 and 316. The gate delays may vary based on changes in the VDD voltage provided to the NAND gate 312 and the inverters 314 and 316, or may vary based on changes in temperature.

The outputs of the serially coupled flip-flops 332, 334, 336, and 338 of the counter circuit 330 may represent a count of oscillations of the ENVCLK. For example, a first oscillation will set the Q output of the flip-flop 332. A second oscillation will set the Q output of the flip-flop 334. The Q outputs of the flip-flops 336 and 338 will likewise be set based on the third and fourth oscillations, respectively, of the ENVCLK signal. In the example counter circuit 330, up to four oscillations may be counted. It is appreciated that more or fewer flip-flops may be included to count more or fewer oscillations.

After a count period, in response to the CNTCLK signal, the calculation circuit 350 may latch the Q outputs of the flip-flops 332, 334, 336, and 338 at the flip-flops 351, 353, 355, and 357 as the current oscillation count (e.g., A[3:0]) provided to the digital compare circuit 359. The calculation circuit 350 may contemporaneously latch the previously latched Q outputs of the flip-flops 351, 353, 355, and 357 at the flop-flops 352, 354, 356, and 358 as the previous oscillation count (e.g., B[3:0]) provided to the digital compare circuit 359. The digital compare circuit 359 may compare the previous oscillation count B[3:0] and the current oscillation count A[3:0]. In response to the oscillation counts differing by more than a predetermined threshold, the digital compare circuit 359 may provide the PFCS signal having a logic level that indicating that a phase of the ICLK signal has changed.

Figure 4:
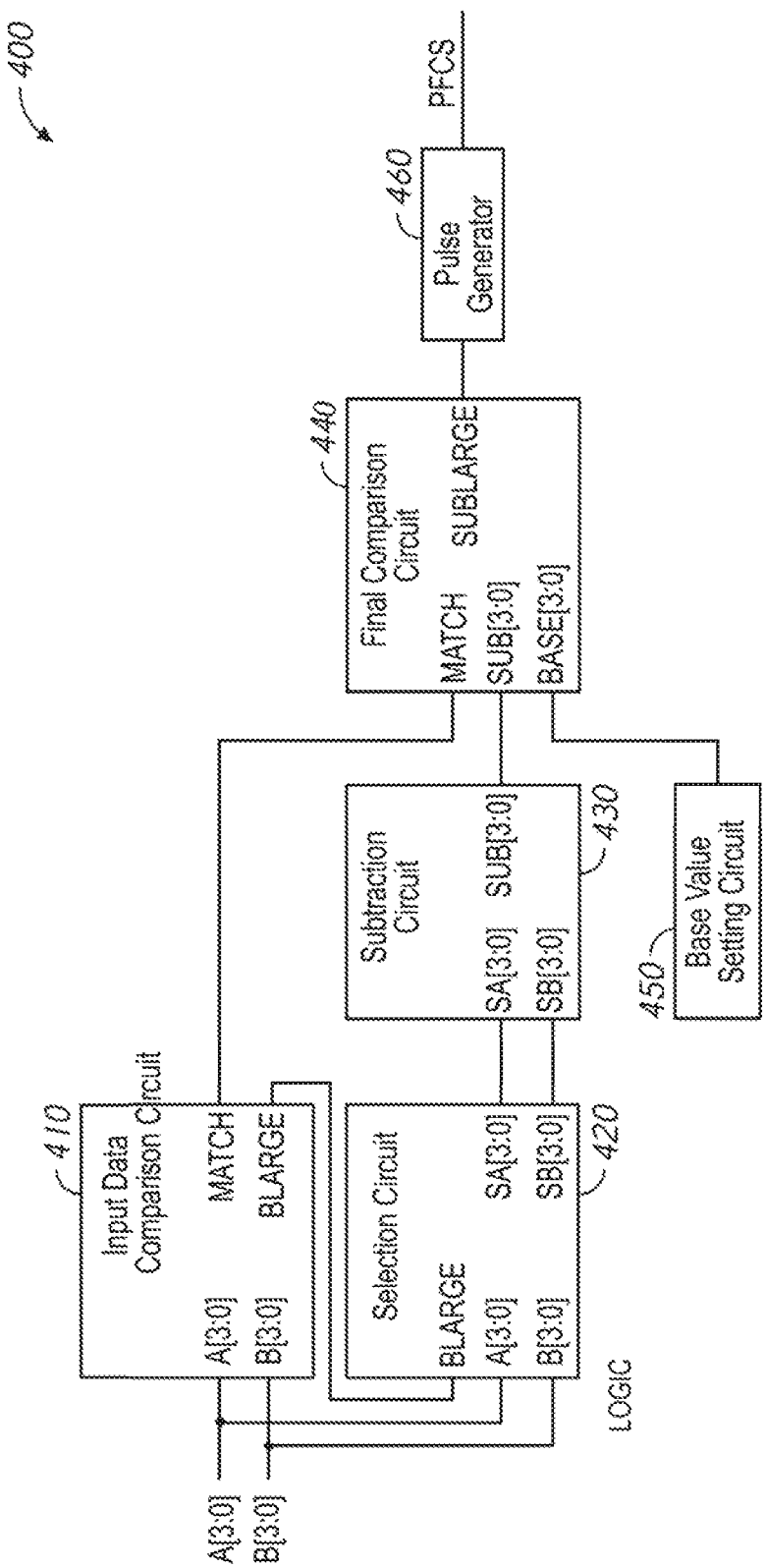
FIG. 4 is a block diagram of a digital compare circuit in accordance with an embodiment of the disclosure.

FIG. 4 depicts a block diagram of a digital compare circuit 400 in accordance with an embodiment of the disclosure. The digital compare circuit 359 of FIG. 3 may be implemented by the digital compare circuit 400, in some embodiments. The digital compare circuit 400 may include a input data comparison circuit 410, a data selection circuit 420, a subtraction circuit 430, a final comparison circuit 440, a base value setting circuit 450, and a pulse generator 460.

The input data comparison circuit 410 may include logic to compare the current oscillation count A[3:0] count with the previous oscillation count B[3:0] count. If the A[3:0] count is greater than the B[3:0] count, the BLARGE signal is set low. If the A[3:0] count is less than the B[3:0] count, the BLARGE signal is set high. If the A[3:0] count is equal to the B[3:0] count, the MATCH signal is set high. The data selection circuit 420 may include logic to arrange the A[3:0] and B[3:0] count such that the subtraction circuit 430 is able to subtract the larger of the A[3:0] count or the B[3:0] count from the other. Thus, when the BLARGE signal is low (e.g., A[3:0] count is greater than B[3:0] count), the subtraction circuit 430 may provide the A[3:0] count as a SA[3:0] count and may provide the B[3:0] count as a SB[3:0] count. When the BLARGE signal is high (e.g., A[3:0] count is less than the B[3:0] count), the subtraction circuit 430 may provide the B[3:0] count as the SA[3:0] count and may provide the A[3:0] count as the SB[3:0] count. The subtraction circuit 430 may subtract the SA[3:0] count from the SB[3:0] count to provide the SUB[3:0] value.

The final comparison circuit 440 may cause the pulse generator 460 to generate a pulse on the PFCS signal in response to a determination that the SUB[3:0] value exceeds a predetermined threshold BASE[3:0] value. The predetermined threshold BASE[3:0] value may be received from a base value setting circuit 450. The predetermined threshold BASE[3:0] value may be variable, configurable or dynamically changed based on operating conditions or other criteria. A SUBLARGE signal may be set high when the MATCH signal is high or when the SUB[3:0] value is less than the predetermined threshold BASE[3:0] value. The SUBLARGE signal may be set low when the SUB[3:0] value is greater than the predetermined threshold BASE[3:0] value. The pulse generator 460 may generate a pulse on the PFCS signal in response to the SUBLARGE signal transitioning low.

It will be appreciated the logic of the digital compare circuit 400 may be altered to achieve a similar result. It will also be appreciated that the digital compare circuit 400 may be altered to receive more than 4 bits per count for the comparison and subtraction operations.

Figure 5:
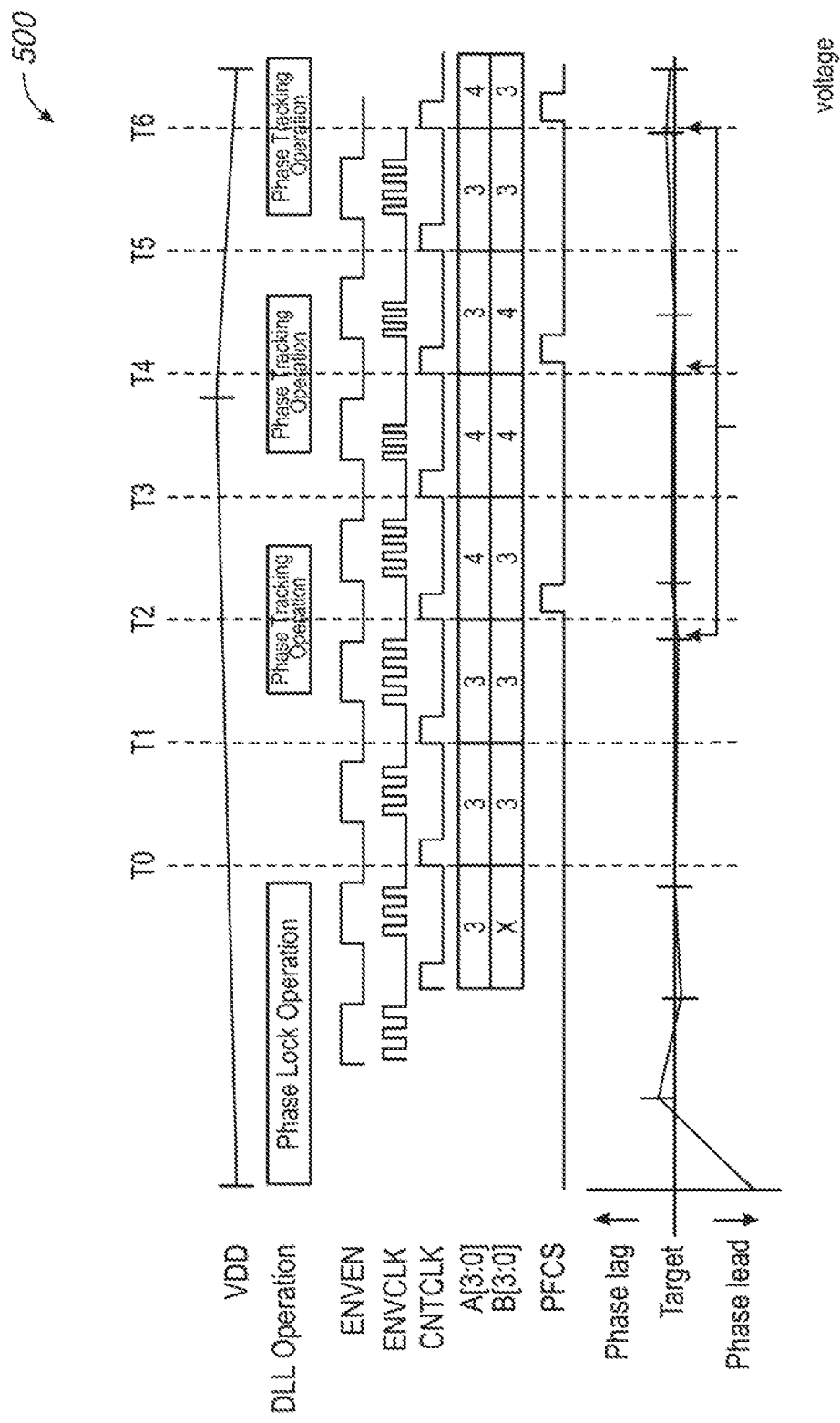
FIGS. 5 and 6 are exemplary timing diagrams depicting operation of a phase deviation detection circuit according to embodiments of the disclosure.
Figure 6:
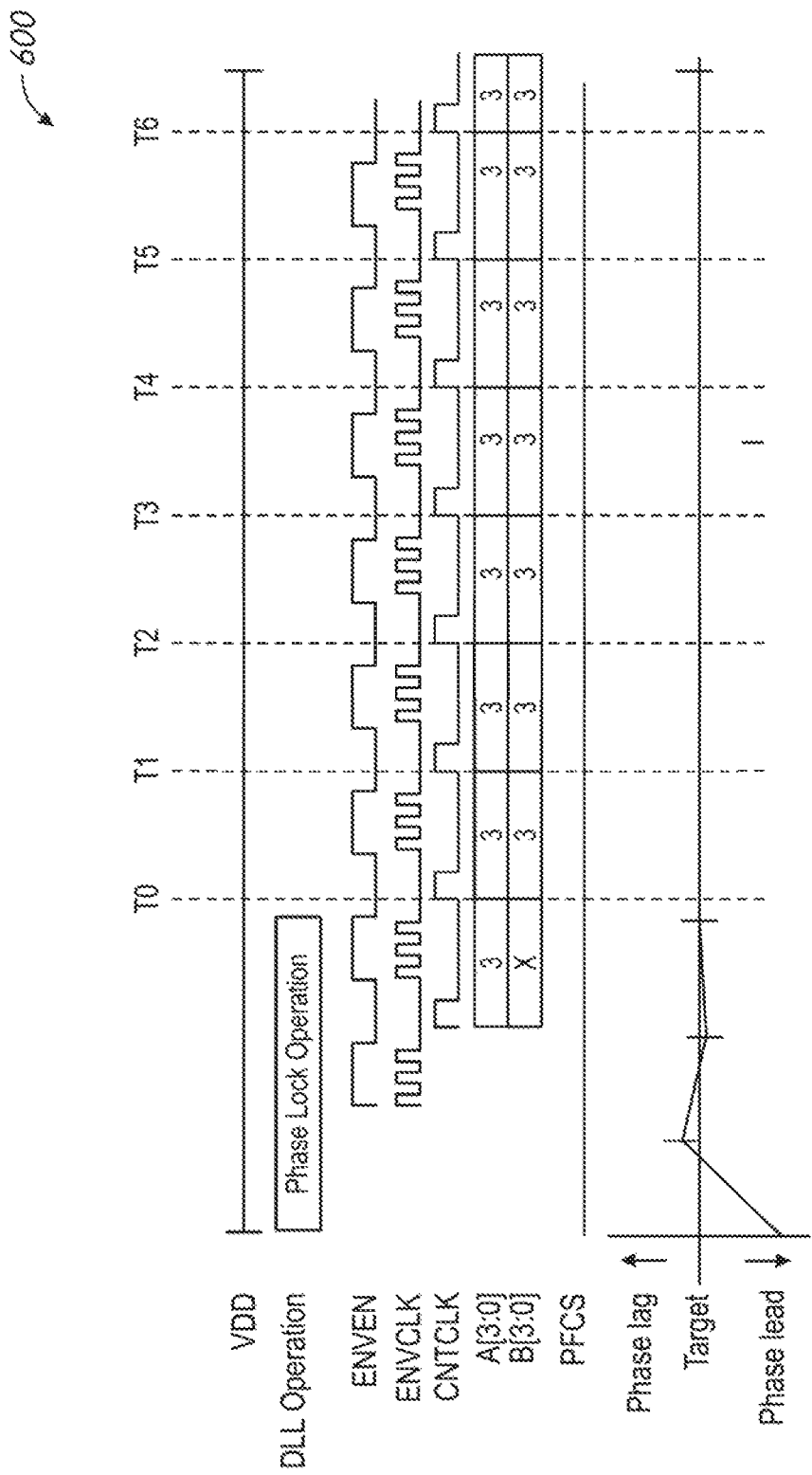

FIGS. 5 and 6 are exemplary timing diagrams 500 and 600, respectively depicting operation of a phase deviation detection circuit according to embodiments of the disclosure. The phase deviation detection circuit may include the phase deviation detection circuit 270 of FIG. 2, the phase deviation detection circuit 300 of FIG. 3, the digital compare circuit 400 of FIG. 4, or combinations thereof. The timing diagram 500 of FIG. 5 depicts a changing VDD voltage that causes a phase to vary over time. In contrast, the timing diagram 600 of FIG. 6 depicts a constant VDD that results in little or no phase variation over time.

Turning now to FIG. 5, prior to time T0, a DLL circuit may perform a phase-lock operation. The DLL circuit may include the internal clock generator 236 of FIG. 2, in some embodiments. Further, the ENVEN signal may toggle high prior to T0. The ENVEN signal may correspond to the ENVEN signal provided from the control circuit 310 of FIG. 3, in some embodiments. In response to the ENVEN signal toggling high, the ENVCLK signal may oscillate at a frequency. The frequency is based on gate delays of logic gates, such as the logic gates of the oscillation circuit 320 of FIG. 3. The gate delays may vary based on the VDD voltage or a temperature.

At time T0, the CNTCLK signal (e.g., from the control circuit 310 of FIG. 3, in some embodiments) may toggle high, and in response to the CNTCLK signal toggling high, a current oscillation count A[3:0] (e.g., via the counter circuit 330 of FIG. 3, in some embodiments) of the ENVCLK signal to be latched at a calculation circuit (e.g., the calculation circuit 350 of FIG. 3). Contemporaneously, a previous oscillation count B[3:0] is latched based on the value (3) from the A[3:0] count immediately prior to time T0. As shown in the example of FIG. 5 at time T0, the previous oscillation count B[3:0] is "3" and the current oscillation count A[3:0] is "3". Between the times T0 and T1, the value "3" of the A[3:0] count is compared (e.g., at the calculation circuit 350 of FIG. 3, in some embodiments, or the digital compare circuit 400 of FIG. 4, in some embodiments) with the value "3" of the B[3:0] count. Because the values match, the PFCS signal remains low.

At time T1, the CNTCLK signal may again toggle high, and in response to the CNTCLK signal toggling high, a current oscillation count A[3:0] of the ENVCLK signal captured between times T0 and T1 to be latched at the calculation circuit. Contemporaneously, a previous oscillation count B[3:0] is latched based on the value of the A[3:0] count immediately prior to time T1. As shown in the example of FIG. 5 at time T1, the previous oscillation count B[3:0] is "3" and the current oscillation count A[3:0] is "3". Between the times T1 and T2, the value "3" of the A[3:0]

count is compared with the value "3" of the B[3:0] count. Because the values match, the PFCS signal remains low.

At time T2, the CNTCLK signal may again toggle high, and in response to the CNTCLK signal toggling high, a current oscillation count A[3:0] of the ENVCLK signal captured between times T1 and T2 to be latched at the calculation circuit. Contemporaneously, a previous oscillation count B[3:0] is latched based on the value of the A[3:0] count immediately prior to time T2. As shown in the example of FIG. 5 at time T2, the previous oscillation count B[3:0] is "3" and the current oscillation count A[3:0] is "4". Between the times T2 and T3, the value "4" of the A[3:0] count is compared with the value "3" of the B[3:0] count. Because the values differ by more than a predetermined threshold of zero (0), a pulse is provided on the PFCS signal between times T2 and T3.

At time T3, the CNTCLK signal may again toggle high, and in response to the CNTCLK signal toggling high, a current oscillation count A[3:0] of the ENVCLK signal captured between times T2 and T3 to be latched at the calculation circuit. Contemporaneously, a previous oscillation count B[3:0] is latched based on the value of the A[3:0] count immediately prior to time T3. As shown in the example of FIG. 5 at time T3, the previous oscillation count B[3:0] is "4" and the current oscillation count A[3:0] is "4". Between the times T3 and T4, the value "4" of the A[3:0] count is compared with the value "4" of the B[3:0] count. Because the values match, the PFCS signal remains low.

At time T4, the CNTCLK signal may again toggle high, and in response to the CNTCLK signal toggling high, a current oscillation count A[3:0] of the ENVCLK signal captured between times T3 and T4 to be latched at the calculation circuit. Contemporaneously, a previous oscillation count B[3:0] is latched based on the value of the A[3:0] count immediately prior to time T4. As shown in the example of FIG. 5 at time T4, the previous oscillation count B[3:0] is "4" and the current oscillation count A[3:0] is "3". Between the times T3 and T4, the value "3" of the A[3:0] count is compared with the value "4" of the B[3:0] count. Because the values differ by more than a predetermined threshold of zero (0), a pulse is provided on the PFCS signal between times T3 and T4.

At time T5, the CNTCLK signal may again toggle high, and in response to the CNTCLK signal toggling high, a current oscillation count A[3:0] of the ENVCLK signal captured between times T4 and T5 to be latched at the calculation circuit. Contemporaneously, a previous oscillation count B[3:0] is latched based on the value (3) of the A[3:0] count immediately prior to time T5. As shown in the example of FIG. 5 at time T5, the previous oscillation count B[3:0] is "3" and the current oscillation count A[3:0] is "3". Between the times T5 and T6, the value "3" of the A[3:0] count is compared with the value "3" of the B[3:0] count. Because the values match, the PFCS signal remains low.

At time T6, the CNTCLK signal may again toggle high, and in response to the CNTCLK signal toggling high, a current oscillation count A[3:0] of the ENVCLK signal captured between times T5 and T6 to be latched at the calculation circuit. Contemporaneously, a previous oscillation count B[3:0] is latched based on the value (3) of the A[3:0] count immediately prior to time T6. As shown in the example of FIG. 5 at time T6, the previous oscillation count B[3:0] is "4" and the current oscillation count A[3:0] is "3". After time T6, the value "4" of the A[3:0] count is compared with the value "3" of the B[3:0] count. Because the values differ by more than a predetermined threshold of zero (0), a pulse is provided on the PFCS signal after time T6.

Turning now to FIG. 6, prior to time T0, a DLL circuit may perform a phase-lock operation. The DLL circuit may include the internal clock generator 236 of FIG. 2 in some embodiments. Further, the ENVEN signal may toggle high prior to T0. The ENVEN signal may correspond to the ENVEN signal provided from the control circuit 310 of FIG. 3 in some embodiments. In response to the ENVEN signal toggling high, the ENVCLK signal may oscillate at a frequency. The frequency is based on gate delays of logic gates, such as the logic gates of the oscillation circuit 320 of FIG. 3. The gate delays may vary based on the VDD voltage or a temperature.

At time T0, the CNTCLK signal (e.g., from the control circuit 310 of FIG. 3 in some embodiments) may toggle high, and in response to the CNTCLK signal toggling high, a current oscillation count A[3:0] (e.g., via the counter circuit 330 of FIG. 3 in some embodiments) of the ENVCLK signal is latched at a calculation circuit (e.g., the calculation circuit 350 of FIG. 3 in some embodiments). Contemporaneously, a previous oscillation count B[3:0] is latched based on the value of the A[3:0] count immediately prior to time T0. As shown in the example of FIG. 6, the B[3:0] count is "3" and the A[3:0] count is "3". Between the times T0 and T1, the value "3" of the A[3:0] count is compared (e.g., at the calculation circuit 350 of FIG. 3 or the digital compare circuit 400 of FIG. 4 in some embodiments) with the value "3" of the B[3:0] count. Because the values match, the PFCS signal remains low.

At time T1, the CNTCLK signal may again toggle high, and in response to the CNTCLK signal toggling high, a current oscillation count A[3:0] of the ENVCLK signal captured between times T0 and T1 to be latched at the calculation circuit. Contemporaneously, a previous oscillation count B[3:0] is latched based on the value of the A[3:0] count immediately prior to time T1. As shown in the example of FIG. 6, the B[3:0] count is "3" and the A[3:0] count is "3". Between the times T1 and T2, the value "3" of the A[3:0] count is compared with the value "3" of the B[3:0] count. Because the values match, the PFCS signal remains low.

At time T2, the CNTCLK signal may again toggle high, and in response to the CNTCLK signal toggling high, a current oscillation count A[3:0] of the ENVCLK signal captured between times T1 and T2 to be latched at the calculation circuit. Contemporaneously, a previous oscillation count B[3:0] is latched based on the value of the A[3:0] count immediately prior to time T2. As shown in the example of FIG. 6, the B[3:0] count is "3" and the A[3:0] count is "3". Between the times T2 and T3, the value "3" of the A[3:0] count is compared with the value "3" of the B[3:0] count. Because the values match, the PFCS signal remains low.

At time T3, the CNTCLK signal may again toggle high, and in response to the CNTCLK signal toggling high, a current oscillation count A[3:0] of the ENVCLK signal captured between times T2 and T3 to be latched at the calculation circuit. Contemporaneously, a previous oscillation count B[3:0] is latched based on the value of the A[3:0] count immediately prior to time T3. As shown in the example of FIG. 6, the B[3:0] count is "3" and the A[3:0] count is "3". Between the times T3 and T4, the value "3" of the A[3:0] count is compared with the value "3" of the B[3:0] count. Because the values match, the PFCS signal remains low.

At time T4, the CNTCLK signal may again toggle high, and in response to the CNTCLK signal toggling high, a current oscillation count A[3:0] of the ENVCLK signal captured between times T3 and T4 to be latched at the calculation circuit. Contemporaneously, a previous oscillation count B[3:0] is latched based on the value of the A[3:0] count immediately prior to time T4. As shown in the example of FIG. 6, the B[3:0] count is "3" and the A[3:0] count is "3". Between the times T4 and T5, the value "3" of the A[3:0] count is compared with the value "3" of the B[3:0] count. Because the values match, the PFCS signal remains low.

At time T5, the CNTCLK signal may again toggle high, and in response to the CNTCLK signal toggling high, a current oscillation count A[3:0] of the ENVCLK signal captured between times T4 and T5 to be latched at the calculation circuit. Contemporaneously, a previous oscillation count B[3:0] is latched based on the value of the A[3:0] count immediately prior to time T5. As shown in the example of FIG. 6, the B[3:0] count is "3" and the A[3:0] count is "3". Between the times T5 and T6, the value "3" of the A[3:0] count is compared with the value "3" of the B[3:0] count. Because the values match, the PFCS signal remains low.

At time T6, the CNTCLK signal may again toggle high, and in response to the CNTCLK signal toggling high, a current oscillation count A[3:0] of the ENVCLK signal captured between times T5 and T6 to be latched at the calculation circuit. Contemporaneously, a previous oscillation count B[3:0] is latched based on the value of the A[3:0] count immediately prior to time T6. As shown in the example of FIG. 6, the B[3:0] count is "3" and the A[3:0] count is "3". After time T6, the value "3" of the A[3:0] count is compared with the value "3" of the B[3:0] count. Because the values match, the PFCS signal remains low.

As shown in FIG. 6, because the VDD voltage remains constant, no voltage variation is detected between times T0 and T6. The timing diagrams 500 and 600 are for illustrative purposes, and it is appreciated that actual relative timing may deviate from the relative timing depicted.

Figure 7:
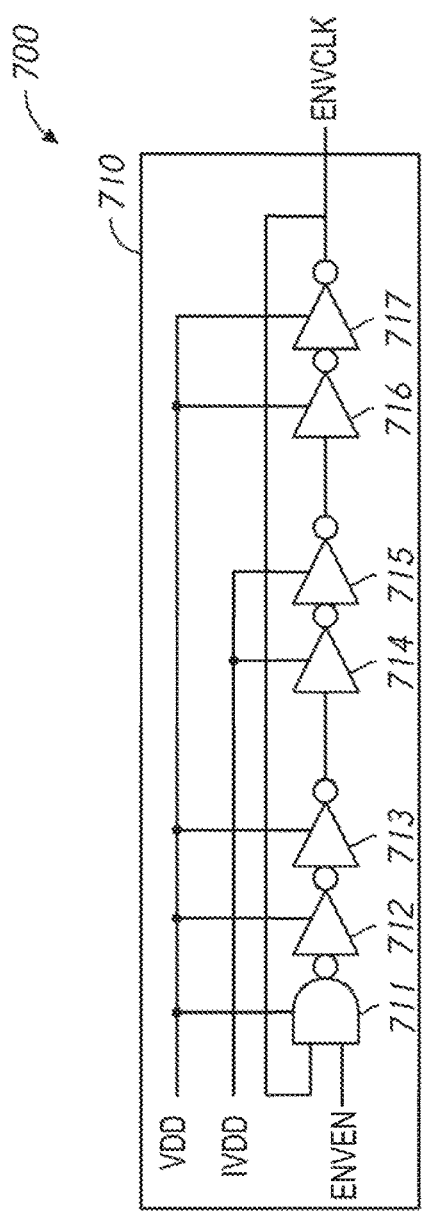
FIGS. 7 and 8 are block diagrams for oscillation circuits in accordance with embodiments of the disclosure.
Figure 8:
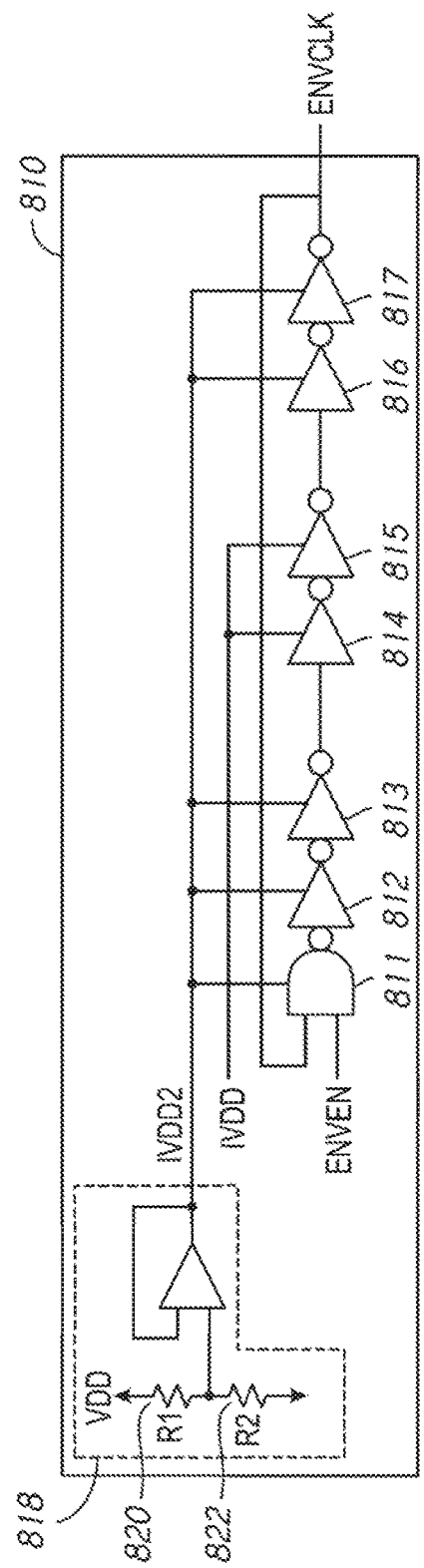

FIGS. 7 and 8 depict block diagrams for alternate embodiments of oscillation circuits 700 and 800 in accordance with embodiments of the disclosure. The oscillation circuit 700 may replace the oscillation circuit 320 of FIG. 3, in some embodiments. The oscillation circuit 800 may replace the oscillation circuit 320 of FIG. 3, in some embodiments. In contrast with the oscillation circuit 320 of FIG. 3, the oscillation circuits 700 and 800 may also indirectly track potential phase changes caused by variation in internal voltages.

Turning now to FIG. 7, the oscillation circuit 700 may receive the ENVEN signal and provide an envelope clock signal ENVCLK at an output. The oscillation circuit 700 may include a NAND gate 711 coupled in series with six inverters 712-717. The NAND gate 711 may receive the ENVEN signal at a first input and an output of the inverter 717 (e.g., the ENVCLK signal) at a second input. The output of the inverter 717 may provide the ENVCLK signal. The NAND gate 711 and the inverters 712, 713, 716, and 717 may be powered by the VDD voltage (e.g., first or external voltage), and the inverters 714 and 715 may be powered by the IVDD voltage (e.g., a second or internal voltage). The oscillation circuit 700 may make variations in either the VDD voltage or the IVDD voltage detectable based on variations in gate delays of the NAND gate and the inverters 712-717. The variations in the gate delays may indicate changes in clock phases.

Turning now to FIG. 8, the oscillation circuit 800 may receive the ENVEN signal and provide an envelope clock signal ENVCLK at an output. The oscillation circuit 800 may include a NAND gate 811 coupled in series with six inverters 812-817. The NAND gate 811 may receive the ENVEN signal at a first input and an output of the inverter 817 (e.g., the ENVCLK signal) at a second input. The output of the inverter 817 may provide the ENVCLK signal. The NAND gate 811 and the inverters 812, 813, 816, and 817 may be powered by the IVDD2 voltage (e.g., first voltage), and the inverters 814 and 815 may be powered by the IVDD voltage (e.g., a second or internal voltage). The IVDD2 voltage may be based on the VDD voltage, but stepped down via a voltage divider circuit 818. The voltage divider circuit is shown in FIG. 8 as including resistances 820 and 822. Voltage dividers of different configurations may be used in other embodiments of the disclosure. Moreover, voltage step-down circuits other than voltage dividers may be used in some embodiments of the disclosure. The lower voltage IVDD2 may still track variations in the VDD voltage, but allow the oscillation circuit to use lower power logic components for the NAND gate 81 land the inverters 812, 813, 816, and 817. Similar to the oscillation circuit 700 of FIG. 7, the oscillation circuit 800 may make variations in either the VDD voltage (e.g., via the IVDD2 voltage) or the IVDD voltage detectable based on variations in gate delays of the NAND gate 81 land the inverters 812-817. The variations in the gate delays may indicate changes in clock phases.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a clock generator circuit configured to adjust a phase of a clock signal based on a phase of a feedback clock signal during an initial phase-lock operation, wherein the clock generator circuit comprises a phase deviation detection circuit configured to detect a variation in a phase of the clock signal based on variations in gate delays of an oscillation circuit, and to initiate a subsequent phase-lock operation in response to detecting variations in the gate delays of the oscillation circuit.

2. The apparatus of claim 1, wherein the phase deviation detection circuit configured to detect variations in the phase of the clock signal based on variations in the gate delays of the oscillation circuit is configured to count oscillations of an oscillation clock signal provided from the oscillation circuit over a predetermined time period to provide a current oscillation count, wherein the phase deviation detection circuit is further configured to compare the current oscillation count with a previous oscillation count to detect variations in the gate delays.

3. The apparatus of claim 2, wherein the phase deviation detection circuit comprises a control circuit having a plurality of serially-coupled flip-flops to set a predetermined time period.

4. The apparatus of claim 2, wherein the phase deviation detection circuit comprises a counter circuit having a plurality of flip-flops configured to sequentially latch individual oscillations of the oscillation clock signal provided from the oscillation circuit.

5. The apparatus of claim 2, wherein the phase deviation detection circuit further comprises a digital compare circuit configured to subtract a larger of the current oscillation count or the previous oscillation count from the smaller of the current oscillation count or the previous oscillation count to provide a difference value and compare the difference value to the predetermined threshold.

6. The apparatus of claim 2, wherein the phase deviation detection circuit further comprises a first storing circuit configured to store the current oscillation count and a second storing circuit to store the previous oscillation count.

7. The apparatus of claim 6, wherein the first storing circuit comprises a plurality of flip-flops each configured to store a bit of the current oscillation count.

8. The apparatus of claim 2, wherein the oscillation circuit comprises a plurality of serially coupled inverters configured to provide the clock signal at an output.

9. The apparatus of claim 8, wherein the plurality of serially coupled inverters are powered by an external power supply, wherein a variation in the gate delays of the plurality of serially coupled inverters is caused by variation in a voltage of the external power supply.

10. The apparatus of claim 8, wherein a first subset of the plurality of serially coupled inverters are powered by a first power supply and a second subset of the plurality of serially coupled inverters are powered by a second power supply, wherein a variation in the gate delays of the plurality of serially coupled inverters is caused by variation in a voltage of either the first power supply or the second power supply.

11. An apparatus comprising:
  a clock adjusting circuit configured to adjust a phase of a clock signal responsive to assertion of an adjust enable signal; and
  a phase deviation detection circuit comprising:
    an oscillator configured to output an internal clock signal during a first period of time and a second period of time;
    a first storing circuit configured to temporarily store a first count value of the internal clock signal outputted during the first period of time;
    a second storing circuit configured to temporarily store a second count value of the internal clock signal outputted during the second period of time; and
    a detector configured to compare the first count value and the second count value and to assert the adjust enable signal when a difference between the first and second count value exceeds a threshold value.

12. The apparatus of claim 11, wherein the phase deviation detection circuit further comprises a period determining circuit configured to determine each of the first period of time and the second period of time based on the clock signal.

13. The apparatus of claim 11, wherein the first storing circuit is further configured to store the second count value before storing the first count value and the second storing circuit is configured to store the second count value when the first storing circuit stores the first count value.

14. The apparatus of claim 11, the threshold value is one.

15. The apparatus of claim 11, the threshold value is variable.

16. A method comprising:
  during an initial phase-lock operation, adjusting a phase of a clock signal based on a phase of a feedback clock signal;
  detecting variations in gate delays of an oscillation circuit; and
  in response to detecting variations in the gate delays of the oscillation circuit, initiating a subsequent phase-lock operation.

17. The method of claim 16, wherein detecting variations in the gate delays of the oscillation circuit includes:
  counting oscillations of a clock signal output from the oscillation circuit over a predetermined time period to provide a current oscillation count; and
  comparing the current oscillation count with a previous oscillation count to detect variations in the gate delays.

18. The method of claim 17, wherein comparing the current oscillation count with the previous oscillation count to detect variations in the gate delays comprises:
  subtracting a larger of the current oscillation count or the previous oscillation count from the smaller of the current oscillation count or the previous oscillation count to provide a difference value;
  comparing the difference to the predetermined threshold; and
  in response to the difference value exceeding the predetermined threshold, determining a variation of the phase of the clock signal.

19. The method of claim 17, further comprising setting the predetermined time period based on a count of oscillations of the clock signal.

20. The method of claim 17, further comprising, contemporaneously
  latching the current oscillation count at a first storing circuit; and
  latching the previous oscillation count at a second storing circuit.

* * * * *